(12) United States Patent
Dinc et al.

(10) Patent No.: US 10,554,233 B2
(45) Date of Patent: Feb. 4, 2020

(54) RECONFIGURABLE RADAR TRANSMITTER

(71) Applicant: International Business Machines Corporation, Armonk, NY (US)

(72) Inventors: Tolga Dinc, New York, NY (US); Mark A. Ferriss, Tarrytown, NY (US); Daniel Joseph Friedman, Sleepy Hollow, NY (US); Wooram Lee, Briarcliff Manor, NY (US); Bodhisatwa Sadhu, Fishkill, NY (US); Alberto Valdes Garcia, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 75 days.

(21) Appl. No.: 15/667,682

(22) Filed: Aug. 3, 2017

(65) Prior Publication Data

US 2019/0044550 A1    Feb. 7, 2019

(51) Int. Cl.
| | |
|---|---|
| *H04B 1/00* | (2006.01) |
| *G01S 7/03* | (2006.01) |
| *G01S 7/282* | (2006.01) |
| *G01S 7/35* | (2006.01) |
| *G01S 13/10* | (2006.01) |

(Continued)

(52) U.S. Cl.
CPC ............. *H04B 1/0082* (2013.01); *G01S 7/03* (2013.01); *G01S 7/282* (2013.01); *G01S 7/35* (2013.01); *G01S 13/10* (2013.01); *G01S 13/284* (2013.01); *G01S 13/325* (2013.01); *G01S 13/34* (2013.01); *H03D 7/1441* (2013.01); *H03D 7/1458* (2013.01); *H03D 7/1483* (2013.01);

(Continued)

(58) Field of Classification Search
CPC . G01S 7/03; G01S 7/282; G01S 13/10; G01S 13/284; G01S 13/325; G01S 13/34; H04B 1/0082

USPC .......................................................... 342/372
See application file for complete search history.

(56) References Cited

U.S. PATENT DOCUMENTS

| | | |
|---|---|---|
| 3,787,853 A | 1/1974 | Brookner |
| 5,325,099 A | 6/1994 | Nemit et al. |

(Continued)

FOREIGN PATENT DOCUMENTS

| | | |
|---|---|---|
| EP | 1617233 A2 | 1/2006 |
| EP | 2045612 A2 | 4/2009 |
| WO | 2008001092 A2 | 1/2008 |

OTHER PUBLICATIONS

International Search Report and Written Opinion for International Application Serial No. PCT/EP2018/069631 dated Oct. 9, 2018, 19 pages.

(Continued)

*Primary Examiner* — Dao L Phan
(74) *Attorney, Agent, or Firm* — Amin, Turocy & Watson, LLP

(57) ABSTRACT

Techniques that facilitate reconfigurable transmission of a radar frequency signal are provided. In one example, a system includes a signal generator and a power modulator. The signal generator provides a radar waveform signal from a set of radar waveform signals. The power modulator divides a local oscillator signal associated with a first frequency and a first amplitude into a first local oscillator signal and a second local oscillator signal. The power modulator also generates a radio frequency signal associated with a second frequency and a second amplitude based on the radar waveform signal, the first local oscillator signal and the second local oscillator signal.

15 Claims, 11 Drawing Sheets

(51) Int. Cl.
*G01S 13/28* (2006.01)
*G01S 13/32* (2006.01)
*G01S 13/34* (2006.01)
*H03D 7/14* (2006.01)
*G01S 13/76* (2006.01)
*H03F 3/20* (2006.01)
*G01S 13/02* (2006.01)

(52) U.S. Cl.
CPC ....... *G01S 13/76* (2013.01); *G01S 2013/0272* (2013.01); *H03F 3/20* (2013.01)

(56) References Cited

U.S. PATENT DOCUMENTS

| | | | |
|---|---|---|---|
| 5,347,283 | A | 9/1994 | Krizek et al. |
| 5,455,543 | A | 10/1995 | Kechkaylo |
| 6,486,827 | B2 | 11/2002 | Small |
| 7,952,516 | B2 | 5/2011 | Atherton |
| 9,494,675 | B2 | 11/2016 | McCorkle |
| 2010/0225374 | A1 | 9/2010 | Forstner et al. |
| 2011/0142093 | A1 | 6/2011 | De Rosa |
| 2015/0285897 | A1 | 10/2015 | Kilty et al. |
| 2016/0156311 | A1 | 6/2016 | Ainspan et al. |
| 2016/0282457 | A1 | 9/2016 | Mazzaro et al. |

OTHER PUBLICATIONS

Chen, et al., "CW/FMCW/Pulse Radar Engines for 24/26 GHz Multi-Standard Applications in 65 nm CMOS," ASSCC 2015, 4 pages.

Tan, et al., "A 79GHz UWB Pulse-Compression Vehicular Radar in 90nm CMOS," IMS 2012, 3 pages.

Arbabian, et al., "A 90 GHz Hybrid Switching Pulsed-Transmitter for Medical Imaging," IEEE Journal of Solid-State Circuits, vol. 45, No. 12, Dec. 2010, 15 pages.

Non-Final Office Action received for U.S. Appl. No. 15/842,589 dated Jun. 26, 2019, 20 pages.

Non-Final Office Action received for U.S. Appl. No. 15/842,589 dated Nov. 14, 2019, 6 pages.

```
                                            ┌─ 1000
1002
  ┌──────────────────────────────────────────────────────┐
  │ DIVIDING, BY A RADAR TRANSMITTER, A SIGNAL SOURCE INTO│
  │ A FIRST LOCAL OSCILLATOR SIGNAL AND A SECOND LOCAL    │
  │ OSCILLATOR SIGNAL                                     │
  └──────────────────────────────────────────────────────┘
                             │
1004                         ▼
  ┌──────────────────────────────────────────────────────┐
  │ GENERATING, BY THE RADAR TRANSMITTER, A FIRST MIXED   │
  │ SIGNAL BY MIXING A FIRST RADAR WAVEFORM SIGNAL FROM   │
  │ A SET OF RADAR WAVEFORM SIGNALS WITH A FIRST LOCAL    │
  │ OSCILLATOR SIGNAL ASSOCIATED WITH A SIGNAL SOURCE     │
  └──────────────────────────────────────────────────────┘
                             │
1006                         ▼
  ┌──────────────────────────────────────────────────────┐
  │ GENERATING, BY THE RADAR TRANSMITTER, A SECOND MIXED  │
  │ SIGNAL BY MIXING A SECOND RADAR WAVEFORM SIGNAL       │
  │ CONFIGURED AS AN ANTIPHASE SIGNAL OF THE FIRST RADAR  │
  │ WAVEFORM SIGNAL WITH A SECOND LOCAL OSCILLATOR        │
  │ SIGNAL ASSOCIATED WITH THE SIGNAL SOURCE              │
  └──────────────────────────────────────────────────────┘
                             │
1008                         ▼
  ┌──────────────────────────────────────────────────────┐
  │ GENERATING, BY THE RADAR TRANSMITTER, A RADIO         │
  │ FREQUENCY SIGNAL BY COMBINING THE FIRST MIXED SIGNAL  │
  │ AND THE SECOND MIXED SIGNAL                           │
  └──────────────────────────────────────────────────────┘
```

FIG. 10

RECONFIGURABLE RADAR TRANSMITTER

STATEMENT REGARDING FEDERALLY SPONSORED RESEARCH OR DEVELOPMENT

This invention was made with Government support under Contract No.: FA8650 09-C-7924 awarded by Defense Advanced Research Projects Agency (DARPA). The Government has certain rights in this invention.

BACKGROUND

The subject disclosure relates to radar transmitters, and more specifically, to a reconfigurable radar transmitter.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, methods, apparatus and/or computer program products that facilitate reconfigurable transmission of a radar frequency signal are described.

According to an embodiment, a system can comprise a signal generator and a power modulator. The signal generator can provide a radar waveform signal from a set of radar waveform signals. The power modulator can divide a local oscillator signal associated with a first frequency and a first amplitude into a first local oscillator signal and a second local oscillator signal. The power modulator can also generate a radio frequency (RF) signal associated with a second frequency and a second amplitude based on the radar waveform signal, the first local oscillator signal and the second local oscillator signal.

According to another embodiment, a method is provided. The method can comprise generating, by a radar transmitter operatively coupled to a processor, a first mixed signal by mixing a first radar waveform signal from a set of radar waveform signals with a first local oscillator signal associated with a signal source. The method can also comprise generating, by the radar transmitter, a second mixed signal by mixing a second radar waveform signal configured as an antiphase signal of the first radar waveform signal with a second local oscillator signal associated with the signal source. Additionally, the method can comprise generating, by the radar transmitter, a radio frequency signal by combining the first mixed signal and the second mixed signal.

According to yet another embodiment, a system can comprise a first power mixer circuit and a second power mixer circuit. The first power mixer circuit can receive a first radar waveform signal as a first baseband signal that is mixed with a first local oscillator signal associated with a signal source. The first radar waveform signal can comprise a first polarity. The second power mixer circuit can receive a second radar waveform signal as a second baseband signal that is mixed with a second local oscillator signal associated with the signal source. The second radar waveform signal can comprise a second polarity that is different than the first polarity. In an embodiment, a waveform shape of the second radar waveform signal can be different than the first radar waveform signal. A radio frequency signal can be generated based on the first baseband signal and the second baseband signal.

DESCRIPTION OF THE DRAWINGS

FIG. 10 illustrates a flow diagram of an example, non-limiting computer-implemented method for facilitating reconfigurable transmission of a radar frequency signal in accordance with one or more embodiments described herein.

DETAILED DESCRIPTION

Figure 1:
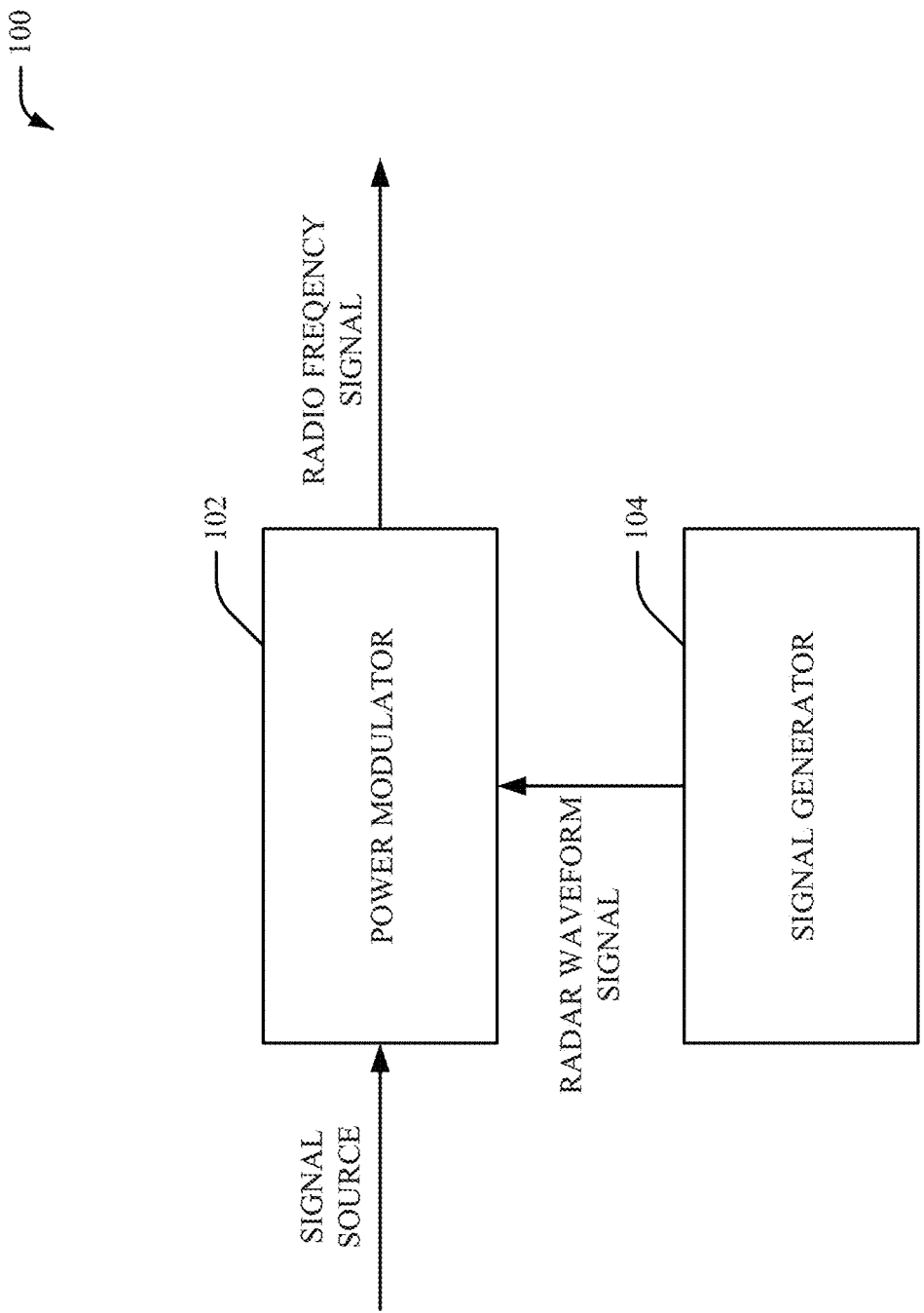
FIG. 1 illustrates a block diagram of an example, non-limiting system associated with a reconfigurable radar transmitter in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

A radar transmitter is an electronic device that generates and radiates a radio frequency signal for a radar application. A radar transmitter can be employed in various technological applications such as medical imaging applications, vehicle radar applications, remote sensing applications, etc.

Embodiments described herein include systems, methods, and computer program products that facilitate reconfigurable transmission of a radar frequency signal. For example, a reconfigurable radar transmitter such as, for example, a wideband reconfigurable radar transmitter can be provided. The reconfigurable radar transmitter can provide a radio frequency signal with different radar waveforms based on different design criteria associated with different technological applications. Design criteria can include, for example, a particular distance requirement, a particular resolution requirement, a particular timing requirement and/or another requirement associated with a technological application. In an embodiment, the different radar waveforms can be generated as a continuous waveform (e.g., a continuous radar waveform). The different radar waveforms can include, for example, a frequency-modulated continuous-wave radar waveform, a continuous-wave radar waveform, a pseudo-random binary sequence radar waveform and/or a pulse radar waveform. In another embodiment, the reconfigurable radar transmitter can include a power splitter that can split a local oscillator signal into a first local oscillator signal and a second local oscillator signal. A waveform of the first local oscillator signal and the second local oscillator signal can be opposite phase.

In an aspect, the first local oscillator signal can be transmitted along a first transmission path (e.g., a first transmission path within the reconfigurable radar transmitter) that includes a first power mixer. The second local oscillator signal can be transmitted along a second transmission path (e.g., a second transmission path within the reconfigurable radar transmitter) that includes a second power mixer. The first power mixer can mix the first local oscillator signal with a first baseband signal associated with a radar waveform selected by a signal generator of the reconfigurable radar transmitter. Furthermore, the second power mixer can mix the second local oscillator signal with a second baseband signal associated with the radar waveform selected by the signal generator of the reconfigurable radar transmitter. As used herein, the term "mix" can mean providing a combination of a first signal and a second signal to generate a third signal, where the first signal and the second signal are different type of signals. For instance, the first signal can be modulated based on the second signal.

The reconfigurable radar transmitter can also include a power combiner that combines signals received from the first power mixer and the second power mixer. For example, a frequency and an amplitude of the signals received from the first power mixer and the second power mixer can be combined. A combined signal generated by the power combiner can be a radio frequency signal that includes a reconfigurable radar waveform. As used herein, the term "combine" can mean to create a combination of a first signal and a second signal to generate a third signal, where the first signal and the second signal a corresponding type of signal. In an embodiment, to generate a radio frequency signal with a short pulse, a first pulse control waveform can be provided to the first power mixer and a second pulse control waveform can be provided to the second power mixer. Furthermore, the first local oscillator signal applied to the first power mixer can have an opposite polarity than the second local oscillator signal provided to the second power mixer. The first pulse control waveform and the second pulse control waveform can be aligned and can comprise different widths. Moreover, the radio frequency signal can comprise a shorter time span that is approximately equal to a difference between a pulse control width of the first pulse control waveform and a pulse control width of the second pulse control waveform. As such, flexibility of a radar transmitter for different technological applications can be improved, waveform generation of a radio frequency signal provided by a radar transmitter can be improved, agility of a radar transmitter (e.g., capability of a radar transmitter to transition between different radar waveform modes) can be improved, bandwidth of a radar transmitter can be improved, bandwidth of a radio frequency signal provided by a radar transmitter can be improved, and/or calibration of a radar transmitter can be improved. Moreover, physical area of a radar transmitter can be reduced and/or complexity of a design of a radar transmitter can be reduced by providing a single reconfigurable radar transmitter.

FIG. 1 illustrates a block diagram of an example, non-limiting system 100 that provides a reconfigurable radar transmitter in accordance with one or more embodiments described herein. In an embodiment, the system 100 can be associated with a reconfigurable wide-band radar transmitter. In various embodiments, the system 100 can be a radar transmitter system associated with technologies such as, but not limited to, transmitter technologies, communication technologies, hardware technologies, pulse generator technologies, radar technologies, imaging technologies, detection technologies, sensor technologies, medical imaging technologies, device control technologies, device movement technologies, vehicle radar technologies, automotive radar technologies, speed estimation technologies, short-distance radar technologies, short-to-mid-distance radar technologies, data extraction technologies, and/or other technologies. The system 100 can employ hardware and/or software to solve problems that are highly technical in nature, that are not abstract and that cannot be performed as a set of mental acts by a human. Further, some of the processes performed may be performed by one or more specialized computers (e.g., one or more specialized circuits, one or more specialized processing units, one or more specialized controllers, etc.) for carrying out defined processes and/or tasks related to a radar transmitter. The system 100 and/or components of the system can be employed to solve new problems that arise through advancements in technologies mentioned above, such as, for example, radar transmitter technologies, particular technological applications, and the like. One or more embodiments of the system 100 can provide technical improvements to transmitter systems, communication systems, hardware systems, pulse generator systems, radar systems, imaging systems, detection systems, sensor systems, medical imaging systems, device control systems, device movement systems, radar systems, automotive radar systems, vehicle radar systems, speed estimation systems, short-distance radar systems, short-to-mid-distance radar systems, data extraction systems and/or other technical systems. One or more embodiments of the system 100 can also provide technical improvements to a radar transmitter by providing a reconfigurable radar transmitter, improving flexibility of a radar transmitter for different technological applications, improving waveform generation of a radio frequency signal provided by a radar transmitter, improving agility of a radar transmitter, improving bandwidth of a radar transmitter, improving calibration of a radar transmitter, reducing physical area of a radar transmitter and/or reducing complexity of a radar transmitter.

In the embodiment shown in FIG. 1, the system 100 can include a power modulator 102 and a signal generator 104. The power modulator 102 and the signal generator 104 can be implemented as a reconfigurable radar transmitter. For example, a reconfigurable radar transmitter can include the power modulator 102 and the signal generator 104. In an embodiment, the power modulator 102 and/or the signal generator 104 can be implemented on a silicon on insulator (SOI) complementary metal-oxide-semiconductor (CMOS) device, a Monolithic Microwave Integrated Circuit (MMIC), a Bipolar junction transistor (BJT) device, a metal-oxide-semiconductor (MOS) device and/or another type of electronic device. Furthermore, the power modulator 102 can be a single stage power modulator that functions simultaneously as a mixer and a power amplifier to improve bandwidth of the power modulator 102 as compared to a multi-stage cascaded architecture for a power modulator.

The power modulator 102 can receive a signal source (e.g., SIGNAL SOURCE shown in FIG. 1). In certain embodiments, the signal source can be generated by a phase-locked loop circuit (not shown) that converts a reference clock into the signal source. In an embodiment, the signal generator 104 can be a base band signal generator. In another embodiment, the signal generator 104 can be a control signal generator. The signal generator 104 can generate a radar waveform signal (e.g., RADAR WAVEFORM SIGNAL shown in FIG. 1). The radar waveform signal can be a base band signal or a control signal associated with a selected waveform. The power modulator 102 can also receive the radar waveform signal generated by the signal generator 104. Based on the signal source and the radar waveform signal, the power modulator 102 can generate a radio frequency (RF) signal (e.g., RADIO FREQUENCY SIGNAL shown in FIG. 1) with a selected radar waveform. For example, the power modulator 102 can be employed to modulate power of the radar waveform and/or the signal source. The power modulator 102 can include power splitter functionality, power mixer functionality and/or power combiner functionality to facilitate generation of the RF signal. For example, the power modulator 102 can mix the signal source and the radar waveform signal to facilitate generation of the RF signal.

In certain embodiments, the signal source can be a local oscillator signal that is mixed with the radar waveform signal. For instance, the power modulator 102 can divide the signal source (e.g., the local oscillator signal) into a first local oscillator signal and a second local oscillator signal. In an aspect, a first phase of the first local oscillator signal can be different than a second phase of the second local oscillator signal. In another embodiment, the signal source can generate a frequency-modulated continuous-wave radar (FMCW) signal. In one example, the signal source (e.g., the local oscillator signal) can be an analog signal such as, for example, a sawtooth non-sinusoidal waveform, a square non-sinusoidal waveform, a rectangle non-sinusoidal waveform, a triangle non-sinusoidal waveform, and/or another type of analog waveform signal. Furthermore, the signal source (e.g., the local oscillator signal) can comprise a first frequency and a first amplitude. The radar waveform signal can be, for example, a baseband signal that is employed for mixing with the signal source. The power modulator 102 can generate the RF signal based on the radar waveform signal, the first local oscillator signal and the second local oscillator signal. The RF signal can comprise a second frequency and a second amplitude. In one example, the second frequency of the RF signal can be different than the first frequency of the signal source. Additionally, the second amplitude of the RF signal can be different than the first amplitude of the signal source. However, in an alternate embodiment, the second frequency of the RF signal can correspond to the first frequency of the signal source and/or the second amplitude of the RF signal can correspond to the first amplitude of the signal source. In an embodiment, the power modulator 102 can mix the first local oscillator signal with a first portion of the radar waveform signal (e.g., a first radar waveform signal) provided by the signal generator 104 to generate a first mixed signal. The first mixed signal can be a first RF signal that is generated by mixing the first local oscillator signal with a first portion of the radar waveform signal. Additionally, the power modulator 102 can mix the second local oscillator signal with a second portion of the radar waveform signal (e.g., a second radar waveform signal) provided by the signal generator 104 to generate a second mixed signal. The second mixed signal can be a second RF signal that is generated by mixing the second local oscillator signal with a second portion of the radar waveform signal. The power modulator 102 can combine the first mixed signal and the second mixed signal to generate the RF signal.

In an embodiment, the signal generator 104 can provide a radar waveform signal from a set of radar waveform signals. The set of radar waveform signals can include, for example, a FMCW signal, a continuous-wave radar (CW) signal, a pseudorandom binary sequence (PRBS) signal and a pulse signal. A FMCW signal is a continuous-wave radar signal where frequency of the continuous-wave radar signal is modulated over time while amplitude of the continuous-wave radar signal is constant. A continuous-wave radar signal is an electromagnetic wave such as a sine wave that comprises a constant amplitude and a constant frequency. A PRBS signal is a binary waveform signal that comprises a binary sequence. A pulse signal is an analog signal or a binary signal that corresponds to a pulse waveform where an amplitude of the analog signal or the binary signal is modified from a baseline value to one or more higher values, and returns form the one or more higher values to a baseline value. In an aspect, the RF signal generated by the power modulator 102 can be a continuous waveform (e.g., a continuous radar waveform) that comprises two or more waveforms. In one example, the RF signal generated by the power modulator 102 can be a mixed continuous waveform that comprises at least a first radar waveform and a second radar waveform that is different than the first radar waveform. In another example, the RF signal generated by the power modulator 102 can be a continuous waveform that comprises at least a first radar waveform that corresponds to a second radar waveform. In an embodiment, the radar waveform signal can be a control signal to alter a configuration of the power modulator 102. For example, the radar waveform signal can be a control signal to alter one or more aspects of the power modulator 102 such that a FMCW signal and/or a CW signal is generated from the signal source. In another example, the radar waveform signal can be a control signal to alter one or more aspects of the power modulator 102 such that a pulse signal is generated based on a first pulse signal and a second pulse signal that comprises a different pulse width than the first pulse signal. The first pulse signal and/or the second pulse signal can be provided by the signal generator 104. Furthermore, the first pulse signal can be subtracted from the second pulse signal to generate the radio frequency signal associated with a pulse waveform and/or to generate a pulse waveform that satisfies a defined criterion (e.g., to generate a pulse waveform that includes a sharp pulse width, to generate a pulse waveform that includes a sharp pulse width, etc.). Alternatively, the second pulse signal can be subtracted from the first pulse signal to generate the radio frequency signal associated with a pulse waveform. In yet another example, the radar waveform signal can be a coded signal to facilitate generation of the radio frequency signal associated with a PRBS waveform. The coded signal can include PRBS code, Barker code associated with a random sequence of radar code and/or other coded data. In certain embodiments, aspects of the signal generator 104 can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. In an aspect, the signal generator 104 can also include memory (not shown) that stores computer executable components and instructions. Furthermore, the signal generator 104 can include a processor (not shown) to facilitate execution of the instructions (e.g., computer executable components and corresponding instructions) by the signal generator 104.

Figure 2:
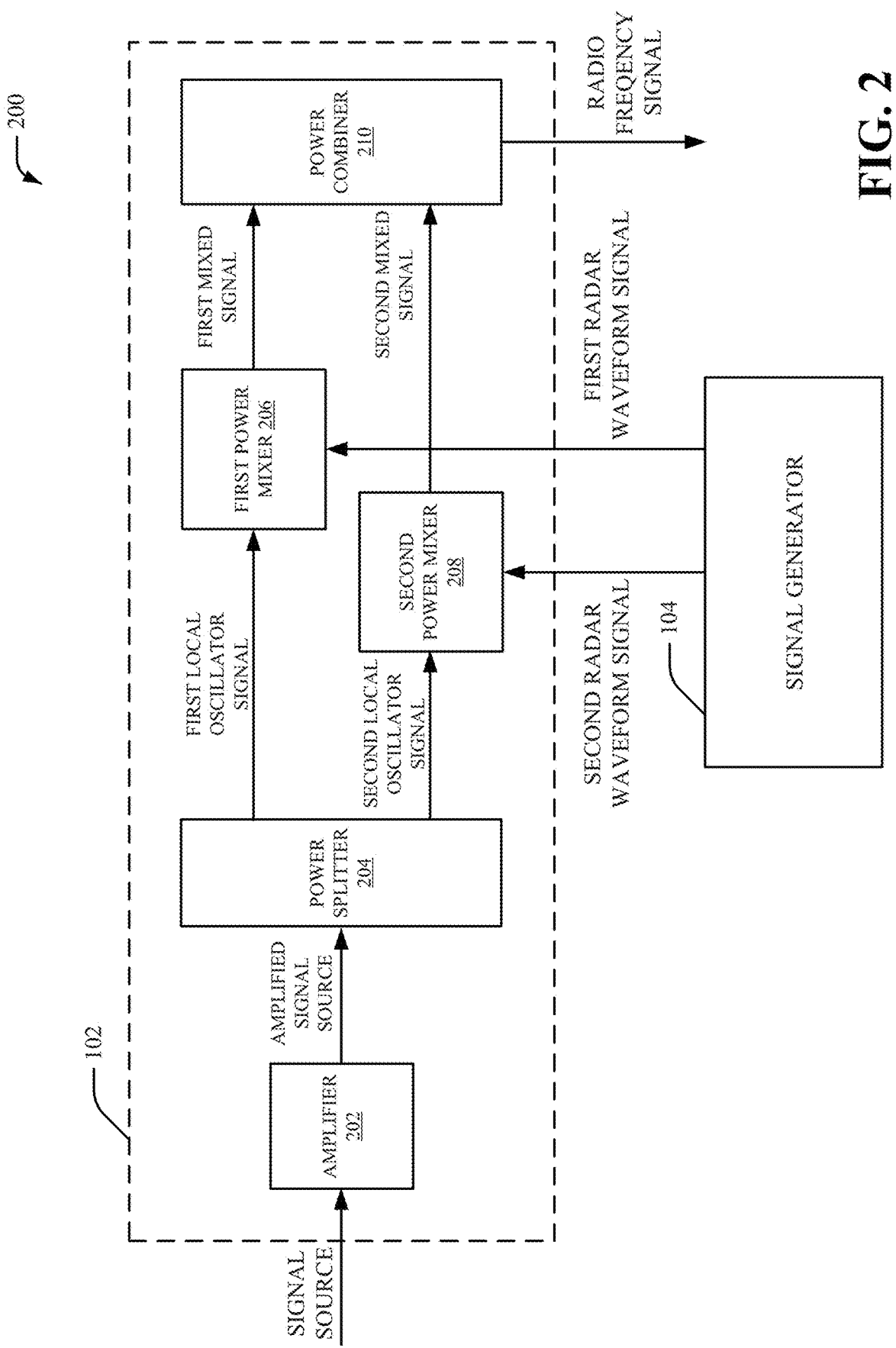
FIG. 2 illustrates a block diagram of another example, non-limiting system associated with a reconfigurable radar transmitter in accordance with one or more embodiments described herein.

FIG. 2 illustrates a block diagram of an example, non-limiting system 200 in accordance with one or more embodiments described herein. Repetitive description of like elements employed in other embodiments described herein is omitted for sake of brevity.

The system 200 includes the power modulator 102 and the signal generator 104. The power modulator 102 can include an amplifier 202, a power splitter 204, a first power mixer 206, a second power mixer 208 and/or a power combiner 210. The first power mixer 206 and the second power mixer 208 can be electronic components that mix a first signal and a second signal, where the first signal and the second signal are different types of signals. The power combiner 210 can be an electronic component that combines a first signal and a second signal, where the first signal and the second signal are a same type of signal. In an embodiment, the signal source can be received by the amplifier 202. The amplifier 202 can amplify the signal source to generate an amplified signal source (e.g., AMPLIFIED SIGNAL SOURCE shown in FIG. 2). The amplified signal source can be received by the power splitter 204. The amplified signal source can also be a local oscillator signal. In an alternate embodiment, the signal source can be directly transmitted to the power splitter 204 (e.g., the power modulator 102 can be implemented without the amplifier 202). The signal source can also be a local oscillator signal. The power splitter 204 can be a power splitter circuit that generates, based on an input signal, a first output signal corresponding to the input signal and a second output signal corresponding to the input signal but with a different phase than the first output signal. Based on the amplified signal source or the signal source, the power splitter 204 can generate a first local oscillator signal (e.g., FIRST LOCAL OSCILLATOR SIGNAL shown in FIG. 2) and a second local oscillator signal (e.g., SECOND LOCAL OSCILLATOR SIGNAL shown in FIG. 2). In an embodiment, the power splitter 204 can divide the amplified signal source or the signal source into the first local oscillator signal and the second local oscillator signal. The first power mixer 206 can receive the first local oscillator signal and a first radar waveform signal (e.g., FIRST RADAR WAVEFORM SIGNAL) generated by the signal generator 104. The second power mixer 208 can receive the second local oscillator signal and a second radar waveform signal (e.g., SECOND RADAR WAVEFORM SIGNAL) generated by the signal generator 104. In an embodiment, the first power mixer 206 can be a first RF mixer circuit and the second power mixer 208 can be a second RF mixer circuit. Based on the first local oscillator signal and the first radar waveform signal, the first power mixer 206 can generate a first mixed signal (e.g., FIRST MIXED SIGNAL shown in FIG. 2). Based on the second local oscillator signal and the second radar waveform signal, the second power mixer 208 can generate a second mixed signal (e.g., SECOND MIXED SIGNAL shown in FIG. 2). The first mixed signal can be a first RF output signal and the second mixed signal can be a second RF output signal. The power combiner 210 can generate the RF signal based on the first mixed signal and the second mixed signal. The power combiner 210 can be a power combiner circuit. In an aspect, the power combiner 210 can combine the first mixed signal and the second mixed signal to generate the RF signal. In an embodiment, the power combiner 210 can include a power amplifier to increase power of the RF signal. The power amplifier of the power combiner 210 can include, for example, a set of transistors to facilitate active combining of the first mixed signal and the second mixed signal. Additionally or alternatively, the power combiner 210 can include a passive power combiner to alter distribution of power of the RF signal. For example, the power combiner 210 can include a Wilkinson power combiner. The passive power combiner of the power combiner 210 can include, for example, a set of capacitors, a set of inductors and/or a set of metal resistors to facilitate passive combining of the first mixed signal and the second mixed signal. Additionally or alternatively, the power combiner 210 can include an antenna to facilitate transmission of the RF signal.

In certain embodiments, the first power mixer 206 can receive the first radar waveform signal as a first baseband signal that is mixed with the first local oscillator signal associated with the signal source. The first radar waveform signal can comprise a first polarity. Furthermore, the second power mixer 208 can receive the second radar waveform signal as a second baseband signal that is mixed with the second local oscillator signal associated with the source input. The second radar waveform signal can comprise a second polarity that is different than the first polarity. Additionally or alternatively, the second radar waveform signal can comprise a different shape than the first radar waveform signal. Additionally, the RF signal can be generated based on the first baseband signal and the second baseband signal. In certain embodiments, the first power mixer 206 can comprise a first transistor structure that receives the first radar waveform signal and the first local oscillator signal. Furthermore, the second power mixer 208 can comprise a second transistor structure that receives the second radar waveform signal and the second local oscillator signal.

Figure 3:
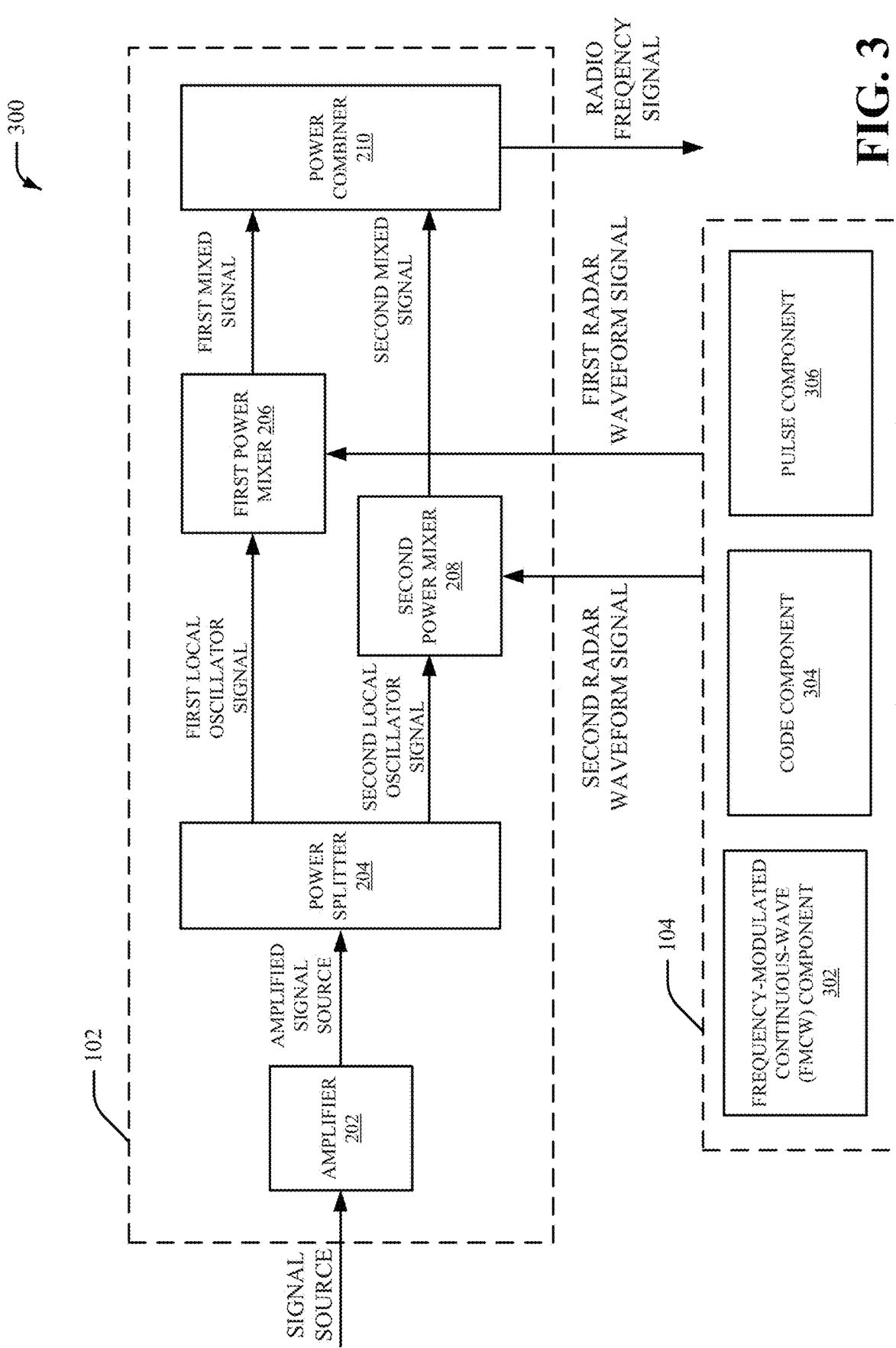
FIG. 3 illustrates a block diagram of yet another example, non-limiting system associated with a reconfigurable radar transmitter in accordance with one or more embodiments described herein.

FIG. 3 illustrates a block diagram of an example, non-limiting system 300 in accordance with one or more embodiments described herein. Repetitive description of like elements employed in other embodiments described herein is omitted for sake of brevity.

The system 300 includes the power modulator 102 and the signal generator 104. The power modulator 102 can include the amplifier 202, the power splitter 204, the first power mixer 206, the second power mixer 208 and/or the power combiner. The signal generator 104 can include a frequency-modulated continuous-wave (FMCW) component 302, a code component 304 and/or a pulse component 306. In one example, the code component 304 can be a pseudorandom binary sequence (PRBS) component. The signal generator 104 can be a controller that generates different radar waveforms by employing the FMCW component 302 associated with a FMCW radar waveform, the code component 304 associated with a PRBS radar waveform and/or the pulse component 306 associated with a pulse radar waveform. For instance, the signal generator 104 can be implemented as a multiplexer device that selects a radar waveform (e.g., a radar waveform from the FMCW component 302, the code component 304 and/or the pulse component 306) for transmission to the power modulator 102. In an embodiment, the FMCW component 302 can provide the radio waveform signal as a FMCW radio waveform signal. For instance, in an embodiment, the FMCW component 302 can generate the first radio waveform signal as a first FMCW radio waveform signal. Furthermore, the FMCW component 302 can generate the second radio waveform signal as a second FMCW radio waveform signal. Alternatively, the FMCW component 302 can provide the radio waveform signal as a CW radio waveform signal. For instance, in an embodiment, the FMCW component 302 can generate the first radio waveform signal as a first CW radio waveform signal. Furthermore, the FMCW component 302 can generate the second radio waveform signal as a second CW radio waveform signal. The first radio waveform signal generated by the FMCW component 302 can be a first baseband signal (e.g., a first FMCW baseband signal or a first CW baseband signal) configured as a direct current signal and the second radio waveform signal generated by the FMCW component 302 can be a second baseband signal (e.g., a second FMCW baseband signal or a second CW baseband signal) configured as a direct current signal to facilitate operation of the power modulator 102 as a power amplifier. In another embodiment, the code component 304 can provide the radio waveform signal as a PRBS radio waveform signal. For instance, in an embodiment, the code component 304 can generate the first radio waveform signal as a first PRBS radio waveform signal. Furthermore, the code component 304 can generate the second radio waveform signal as a second PRBS radio waveform signal. In an alternate embodiment, the code component 304 can generate the first radio waveform signal as a first Barker code radio waveform signal. Furthermore, the code component 304 can generate the second radio waveform signal as a second Barker code radio waveform signal. In an aspect, the first radio waveform signal provided to the first power mixer 206 can comprise an opposite polarity than the second radar waveform signal provided to the second power mixer 208. In yet another embodiment, the pulse component 306 can provide the radio waveform signal as a pulse radio waveform signal. For instance, in an embodiment, the pulse component 306 can generate the first radio waveform signal as a first pulse radio waveform signal. Furthermore, the pulse component 306 can generate the second radio waveform signal as a second pulse radio waveform signal. The first radio waveform signal can be a first baseband signal and the second radio waveform signal can be as second baseband signal. Moreover, the first radio waveform signal and the second radio waveform signal provided by the pulse component 306 can comprise relatively wide pulses with slightly different width. For example, the first radio waveform signal and the second radio waveform signal can be aligned at a rising edge and can comprise a different pulse width. Since the first local oscillator signal provided to the first power mixer 206 has an opposite polarity than the second local oscillator signal provided to the second power mixer 208, when the first radio waveform signal and the second radio waveform signal are 'high', the first mixed signal from the first power mixer 206 and the second mixed signal from the second power mixer 208 can cancel. However, for a short period of time when the first radio waveform signal is 'high' and the second radio waveform signal is low' (or when the first radio waveform signal is low' and the second radio waveform signal is 'high'), the first mixed signal from the first power mixer 206 and the second mixed signal from the second power mixer 208 do not cancel and the power combiner 210 can produce a radio frequency signal with a narrow pulse. As such, improved radar accuracy can be provided.

In certain embodiments, the first radar waveform signal can be a first control signal and the second radar waveform signal can be a second control signal. In an embodiment, the FMCW component 302 can provide the first radar waveform signal as a first control signal for the first power mixer 206 and/or can provide the second radar waveform signal as a second control signal for the second power mixer 208 to allow a FMCW signal and/or a CW signal to be generated from the signal source. In another embodiment, the code component 304 can provide the first radar waveform signal as a first coded signal for the first power mixer 206 and/or can provide the second radar waveform signal as a second coded signal for the second power mixer 208 to facilitate generation of the radio frequency signal associated with a PRBS waveform. The first coded signal provided by the code component 304 can include PRBS code, Barker code associated with a random sequence of radar code and/or other coded data. Furthermore, the second coded signal provided by the code component 304 can comprise an opposite polarity than the first coded signal. Furthermore, the second coded signal can include PRBS code, Barker code associated with a random sequence of radar code and/or other coded data. In yet another embodiment, the pulse component 306 can provide the provide the first radar waveform signal as a first pulse signal (e.g., a first pulse control signal) for the first power mixer 206 and/or can provide the second radar waveform signal as a second pulse signal (e.g., a second pulse control signal) for the second power mixer 208 to allow a pulse signal associated with the radio frequency signal to be generated based on the first pulse signal and the second pulse signal. The second pulse signal provided by the pulse component 306 can comprise a different pulse width than the first pulse signal provided by the pulse component 306. Furthermore, the first pulse signal can be subtracted from the second pulse signal to generate the radio frequency signal associated with a pulse waveform. Alternatively, the second pulse signal can be subtracted from the first pulse signal to generate the radio frequency signal associated with a pulse waveform. As such, a total pulse time duration for the radio frequency signal can be reduced. The first pulse signal (e.g., the first pulse control signal) can be a first digital pulse signal and the second pulse signal (e.g., the second pulse control signal) can be a second digital pulse signal that comprises a different pulse width value than the first pulse signal. The radio frequency signal provided by the power combiner 210 can be a sinusoidal pulse signal.

In certain embodiments, aspects of the signal generator 104 can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. In an aspect, the signal generator 104 can also include a memory that stores computer executable components and instructions. Furthermore, the signal generator 104 can include a processor to facilitate execution of the instructions (e.g., computer executable components and corresponding instructions) by the signal generator 104. In an aspect, include the FMCW component 302, the code component 304 and/or the pulse component 306, the memory and/or the processor can be electrically and/or communicatively coupled to one another in one or more embodiments.

Figure 4:
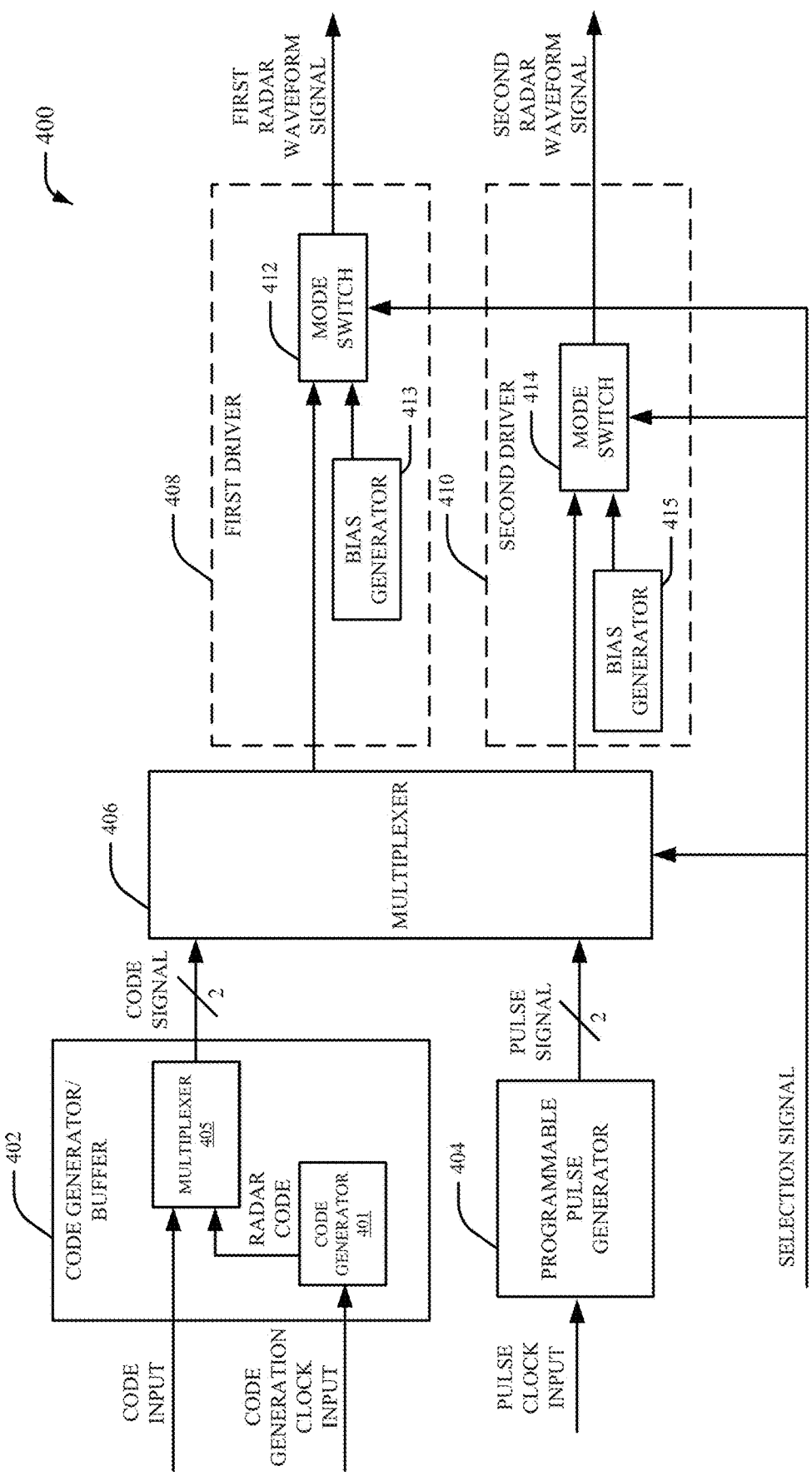
FIG. 4 illustrates a block diagram of an example, non-limiting system associated with a signal generator in accordance with one or more embodiments described herein.

FIG. 4 illustrates a block diagram of an example, non-limiting system 400 in accordance with one or more embodiments described herein. Repetitive description of like elements employed in other embodiments described herein is omitted for sake of brevity.

The system 400 can illustrate an embodiment of the signal generator 104. The system 400 can include a code generator/buffer 402, a programmable pulse generator 404, a multiplexer 406, a first driver 408 and/or a second driver 410. The first driver 408 can include at least a mode switch 412. The second driver 410 can include at least a mode switch 414. The code generator/buffer 402 can receive a code input (e.g., CODE INPUT shown in FIG. 4). The code input can be, for example, a PRBS input. Based on the code input, the code generator/buffer 402 can generate a code signal (e.g., CODE SIGNAL shown in FIG. 4). The code signal can be, for example, a PRBS signal. The code signal can include PRBS code, Barker code associated with a random sequence of radar code and/or other coded data. In one example, the code generator/buffer 402 can buffer the code input to facilitate generation of the code signal. In another example, the code generator/buffer 402 can additionally receive a code generation clock input (e.g., CODE GENERATION CLOCK INPUT shown in FIG. 4). In an embodiment, the code generator/buffer 402 can include a code generator 401 and a multiplexer 405. The code generator 401 can receive the code generation clock input. Based on the code generation clock input, the code generator 401 can generate RADAR code (e.g., RADAR CODE shown in FIG. 4). In one example, the RADAR code can be a PRBS code signal generated based on the code generation clock input. The multiplexer 405 can receive the code input and the RADAR code. Furthermore, the multiplexer 405 can select either the code input (e.g., external code input) or the radar code (e.g., an internally generated code signal) as the code signal. As such, in certain embodiments, the code signal can be generated internally by the code generator/buffer 402 for a given code generation clock input. In an aspect, the code generator/buffer 402 can be an amplifier and/or a buffer for the code input. In another embodiment, the code signal can comprise a first code signal and a second code signal. In one example, the first code signal can be an inverted version of the second code signal (or the second code signal can be an inverted version of the first code signal). Together, the first code signal and the second code signal can be considered a differential code signal. The programmable pulse generator 404 can receive a pulse clock input (e.g., PULSE CLOCK INPUT shown in FIG. 4). The programmable pulse generator 404 can include programmable delay generator and/or a set of logic gates. Based on the pulse clock input, the programmable pulse generator 404 can generate a pulse signal (e.g., PULSE SIGNAL shown in FIG. 4). In an embodiment, the pulse signal can comprise a first pulse signal and a second pulse signal. In one example, the first pulse signal can be aligned with the second pulse signal. Furthermore, a pulse of the first pulse signal can be shorter than a pulse of the second pulse signal (or a pulse of the second pulse signal can be shorter than a pulse of the first pulse signal). The multiplexer 406 can receive the code signal and the pulse signal. The multiplexer 406 can select either the code signal or the pulse signal as an output. Moreover, a selection signal (e.g., SELECTION SIGNAL shown in FIG. 4) can be provided to the mode switch 412 of the first driver 408 and the mode switch 414 of the second driver 410. Based on the selection signal, the mode switch 412 and the mode switch 414 can select wither to pass a signal (e.g., the code signal or the pulse signal) from the multiplexer 406 or a DC signal (e.g., for a CW radar waveform signal or a FMCW radar waveform signal). In response to selection of the code signal by the multiplexer 406, the code signal can be provided to the first driver 408. In certain embodiments, the first driver 408 can include a level shifter (not shown) that can modify a voltage level of the code signal. For example, the level shifter can change a voltage level of the code signal to properly drive the power modulator 102. In certain embodiments, the code signal can be buffered using one or more inverters prior to modifying a voltage level of the code signal.

Furthermore, the mode switch 412 of the first driver 408 can generate a FMCW radar waveform signal or a CW radar waveform signal. In certain embodiments, the mode switch 412 can include a set of logic gates to facilitate selection of a mode. The FMCW radar waveform signal or the CW radar waveform signal can be provided as the first radar waveform signal. In response to selection of the code signal by the multiplexer 406, the code signal can also be provided to the second driver 410. In certain embodiments, the second driver 410 can include a level shifter (not shown) that can modify a voltage level of the code signal. In certain embodiments, the code signal can be buffered using one or more inverters prior to modifying a voltage level of the code signal. Furthermore, the mode switch 414 of the second driver 410 can generate a FMCW radar waveform signal or a CW radar waveform signal based on the code signal that comprises the modified voltage level. In certain embodiments, the mode switch 414 can include a set of logic gates to facilitate selection of a mode. The FMCW radar waveform signal or the CW radar waveform signal can be provided as the second radar waveform signal. In an aspect, the second radar waveform signal can comprise an opposite polarity than the first radar waveform signal. The mode switch 414 of the second driver 410 can provide the opposite polarity for the second radar waveform signal.

However, in response to selection of the pulse signal by the multiplexer 406, the pulse signal can be provided to the second driver 410. In certain embodiments, the first driver 408 can include a level shifter (not shown) that can modify a voltage level of the pulse signal. In certain embodiments, the pulse signal can be buffered using one or more inverters prior to modifying a voltage level of the pulse signal. Furthermore, the mode switch 412 of the first driver 408 can generate a first pulse signal or a second pulse signal based on the pulse signal that comprises the modified voltage level. The first pulse signal or the second pulse signal can be provided as the first radar waveform signal. In response to selection of the pulse signal by the multiplexer 406, the pulse signal can also be provided to the second driver 410. In certain embodiments, the second driver 410 can include a level shifter (not shown) that can modify a voltage level of the pulse signal. In certain embodiments, the pulse signal can be buffered using one or more inverters prior to modifying a voltage level of the pulse signal. Furthermore, the mode switch 414 of the second driver 410 can generate a first pulse signal or a second pulse signal based on the pulse signal that comprises the modified voltage level. The first pulse signal or the second pulse signal can be provided as the second radar waveform signal. In an embodiment, the first radar waveform signal can be provided as a first signal path for the first radar waveform signal with a first polarity and a second signal path for the first radar waveform signal with a second polarity that is opposite from the first polarity for the first radar waveform signal. Additionally, the second radar waveform signal can be provided as a first signal path for the second radar waveform signal with a first polarity and a second signal path for the second radar waveform signal with a second polarity that is opposite from the first polarity for the second radar waveform signal. In certain embodiments, the first driver 408 can include a bias generator 413 that provides a voltage bias to the mode switch 412. Furthermore, in certain embodiments, the second driver 410 can include a bias generator 415 that provides a voltage bias to the mode switch 414.

Figure 5:
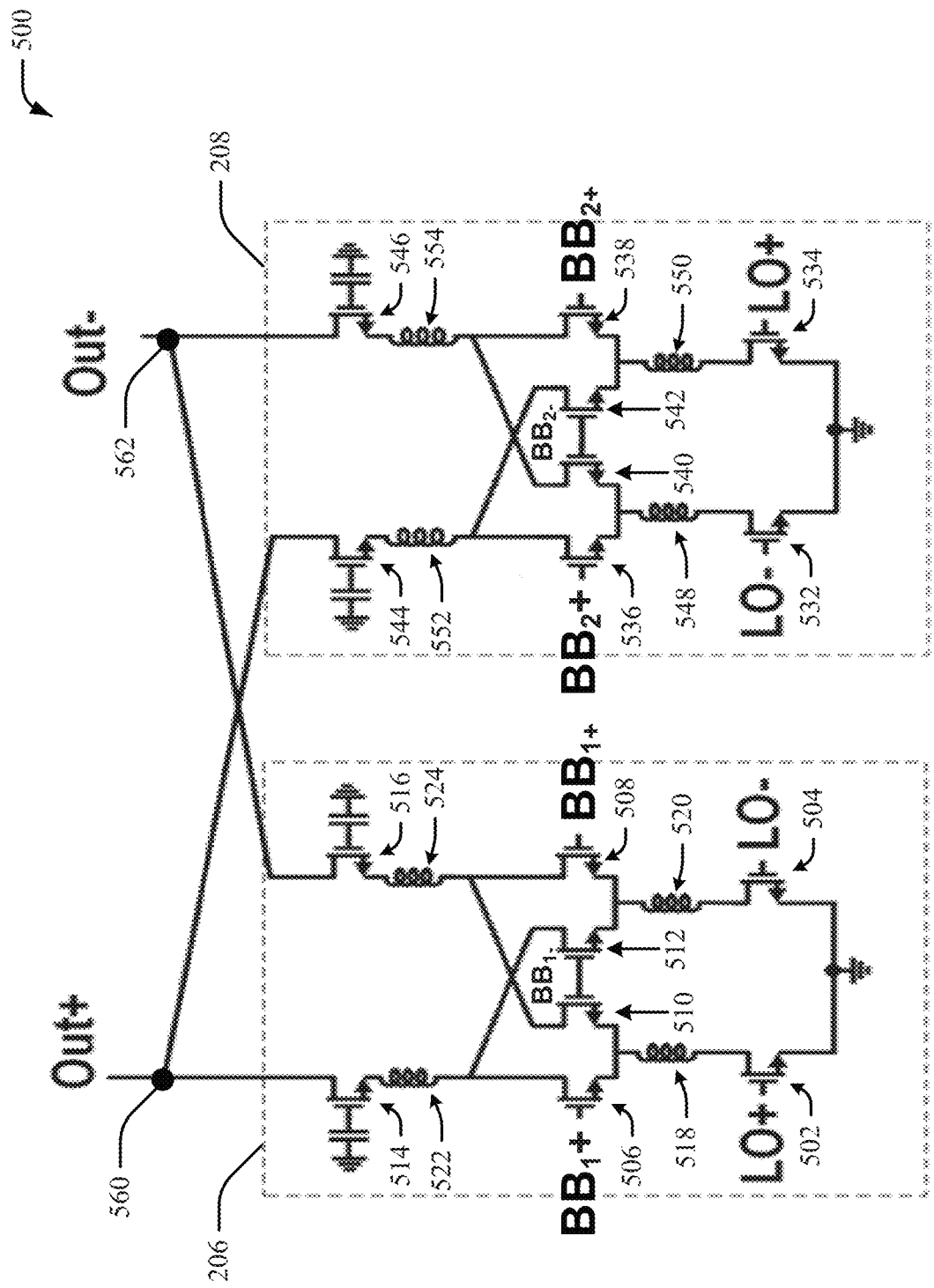
FIG. 5 illustrates a block diagram of an example, non-limiting system associated with a first power mixer and a second power mixer in accordance with one or more embodiments described herein.

FIG. 5 illustrates a block diagram of an example, non-limiting system 500 in accordance with one or more embodiments described herein. Repetitive description of like elements employed in other embodiments described herein is omitted for sake of brevity.

The system 500 can illustrate an embodiment of the first power mixer 206 and the second power mixer 208. The first power mixer 206 and the second power mixer 208 shown in FIG. 5 can facilitate generation of the first mixed signal and the second mixed signal. For instance, a signal Out+ shown in FIG. 5 can correspond to a first portion of the first mixed signal and a first portion of the second mixed signal with a same polarity. Furthermore, a signal Out− shown in FIG. 5 can correspond to a second portion of the first mixed signal and a second portion of the second mixed signal with a same polarity. The first power mixer 206 can include a transistor 502, a transistor 504, a transistor 506, a transistor 508, a transistor 510, a transistor 512, a transistor 514 and a transistor 516. In an embodiment, the transistor 502, the transistor 504, the transistor 506, the transistor 508, the transistor 510, the transistor 512, the transistor 514 and/or the transistor 516 can be a metal-oxide-semiconductor field-effect transistor. A gate of the transistor 502 can receive a signal LO+ and a gate of the transistor 504 can receive a signal LO−. The signal LO+ and the signal LO− can be antiphase signals where a phase difference between the signal LO+ and the signal LO− is equal to 180 degrees. Furthermore, the signal LO+ and the signal LO− can represent the first local oscillator signal provided by the power splitter 204.

A gate of the transistor 506 and a gate of the transistor 508 can receive a signal $BB_1+$. A gate of the transistor 510 and a gate of the transistor 512 can receive a signal $BB_1-$. The signal $BB_1+$ and the signal $BB_1-$ can be antiphase signals where a phase difference between the signal $BB_1+$ and the signal $BB_1-$ is equal to 180 degrees. The signal $BB_1+$ and the signal $BB_1-$ can also be baseband signals. Furthermore, the signal $BB_1+$ and the signal $BB_1-$ can represent the first radar waveform signal provided by the signal generator 104. A source of the transistor 502 can be electrically connected to a source of the transistor 504. The source of the transistor 502 and the source of the transistor 504 can also be connected to electrical ground. A drain of the transistor 502 can be electrically connected to a first end of an inductor 518. A second end of the inductor 518 can be electrically connected to a source of the transistor 506 and a source of the transistor 510. A drain of the transistor 504 can be electrically connected to a first end of an inductor 520. A second end of the inductor 520 can be electrically connected to a source of the transistor 508 and a source of the transistor 512. Furthermore, a gate of the transistor 510 can be electrically connected to a gate of the transistor 512. A drain of the transistor 506 can be electrically connected to a first end of an inductor 522 and a drain of the transistor 512. A drain of the transistor 508 can be electrically connected to a first end of an inductor 524 and a drain of the transistor 510. A source of the transistor 514 can be electrically connected to a second end of the inductor 522. Furthermore, a source of the transistor 516 can be electrically connected to a second end of the inductor 524.

The second power mixer 208 can include a transistor 532, a transistor 534, a transistor 536, a transistor 538, a transistor 540, a transistor 542, a transistor 544 and a transistor 546. In an embodiment, the transistor 532, the transistor 534, the transistor 536, the transistor 538, the transistor 540, the transistor 542, the transistor 544 and/or the transistor 546 can be a metal-oxide-semiconductor field-effect transistor. A gate of the transistor 532 can receive a signal LO− and a gate of the transistor 534 can receive a signal LO+. The signal LO− and the signal LO+ can be antiphase signals where a phase difference between the signal LO− and the signal LO+ is equal to 180 degrees. Furthermore, the signal LO− and the signal LO+ can represent the second local oscillator signal provided by the power splitter 204.

A gate of the transistor 536 and a gate of the transistor 538 can receive a signal $BB_2+$. A gate of the transistor 540 and a gate of the transistor 542 can receive a signal $BB_2-$. The signal $BB_2+$ and the signal $BB_2-$ can be antiphase signals where a phase difference between the signal $BB_2+$ and the signal $BB_2-$ is equal to 180 degrees. The signal $BB_2+$ and the signal $BB_2-$ can also be baseband signals. Furthermore, the signal $BB_2+$ and the signal $BB_2-$ can represent the second radar waveform signal provided by the signal generator 104. A source of the transistor 532 can be electrically connected to a source of the transistor 534. The source of the transistor 532 and the source of the transistor 534 can also be connected to electrical ground. A drain of the transistor 532 can be electrically connected to a first end of an inductor 548. A second end of the inductor 548 can be electrically connected to a source of the transistor 536 and a source of the transistor 540. A drain of the transistor 534 can be electrically connected to a first end of an inductor 550. A second end of the inductor 550 can be electrically connected to a source of the transistor 538 and a source of the transistor 542. Furthermore, a gate of the transistor 540 can be electrically connected to a gate of the transistor 542. A drain of the transistor 536 can be electrically connected to a first end of an inductor 552 and a drain of the transistor 542. A drain of the transistor 538 can be electrically connected to a first end of an inductor 554 and a drain of the transistor 540. A source of the transistor 544 can be electrically connected to a second end of the inductor 552 and a source of the transistor 546 can be electrically connected to a second end of the inductor 554.

A drain of the transistor 514 and a drain of the transistor 512 can provide the first mixed signal. A drain of the transistor 544 and a drain of the transistor 542 can provide the second mixed signal. Furthermore, the drain of the transistor 514 can be electrically connected to the drain of the transistor 544 to form an electrical node 560. Furthermore, the drain of the transistor 516 can be electrically connected to the drain of the transistor 546 to form an electrical node 562. The electrical node 560 can be associated with the signal Out+ and the electrical node 562 can be associated with the signal Out−. The signal Out+ can correspond to a first portion of the first mixed signal and a first portion of the second mixed signal with a same polarity. The signal Out− can correspond to a second portion of the first mixed signal and a second portion of the second mixed signal with a same polarity. A gate of the transistor 514 can be connected to electrical ground. A gate of the transistor 516 can be connected to electrical ground. In certain embodiments, the gate of the transistor 514 can be electrically connected to a first capacitor and/or the gate of the transistor 516 can be electrically connected to a second capacitor. A gate of the transistor 544 can be connected to electrical ground and a gate of the transistor 546 can be connected to electrical ground. In certain embodiments, the gate of the transistor 544 can be electrically connected to a third capacitor and/or the gate of the transistor 546 can be electrically connected to a fourth capacitor.

Figure 6:
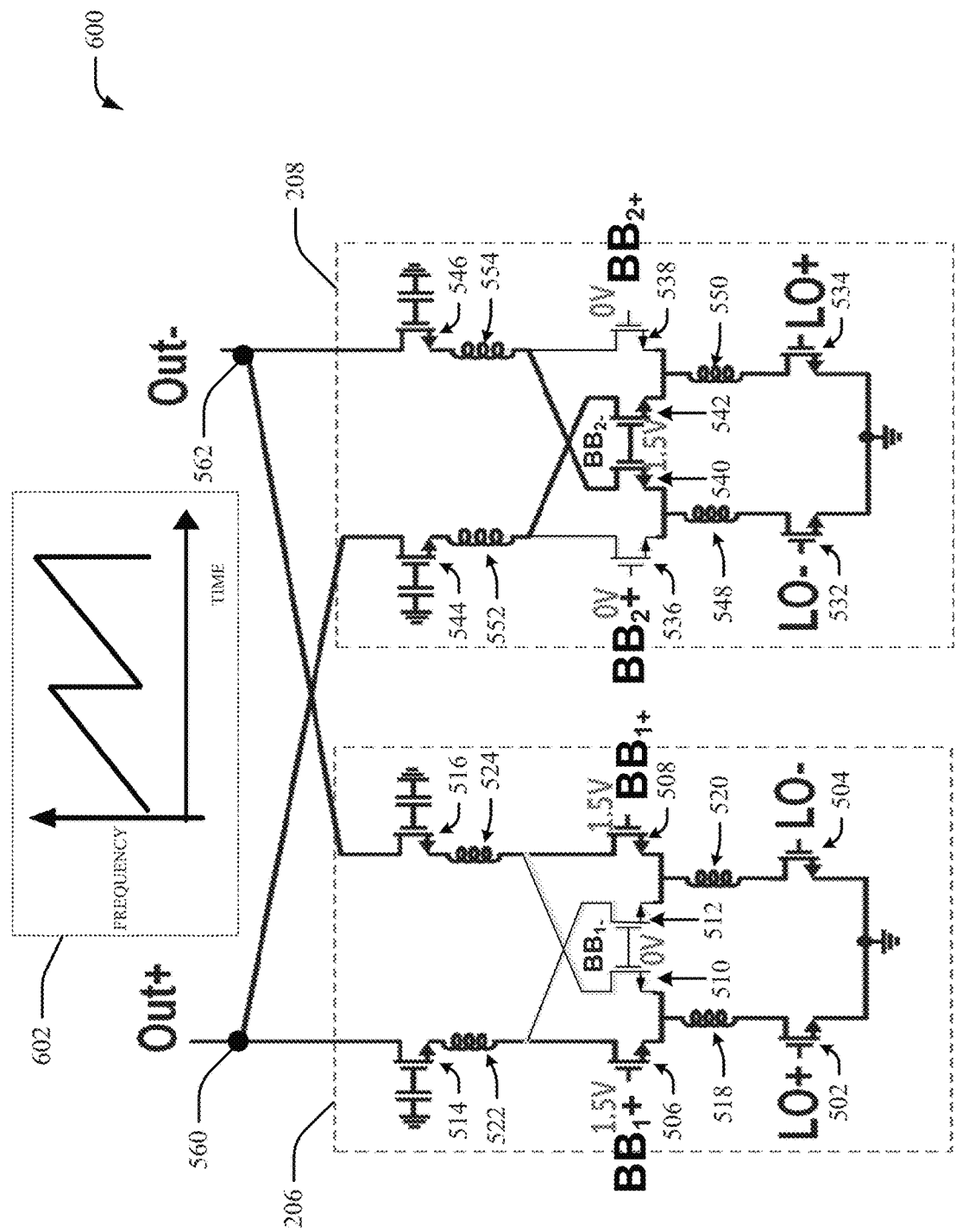
FIG. 6 illustrates a block diagram of an example, non-limiting system associated with a frequency-modulated continuous-wave mode in accordance with one or more embodiments described herein.

FIG. 6 illustrates a block diagram of an example, non-limiting system 600 in accordance with one or more embodiments described herein. Repetitive description of like elements employed in other embodiments described herein is omitted for sake of brevity.

The system 600 can include the first power mixer 206 and the second power mixer 208. The first power mixer 206 can include the transistor 502, the transistor 504, the transistor 506, the transistor 508, the transistor 510, the transistor 512, the transistor 514, the transistor 516, the inductor 518, the inductor 520, the inductor 522 and/or the inductor 524. The second power mixer 208 can include the transistor 532, the transistor 534, the transistor 536, the transistor 538, the transistor 540, the transistor 542, the transistor 544, the transistor 546, the inductor 548, the inductor 550, the inductor 522 and/or the inductor 554.

The system 600 can illustrate an embodiment of the first power mixer 206 and the second power mixer 208 during a FMCW mode. The signal $BB_1+$ (e.g., the gate of the transistor 506 and the gate of the transistor 508) can be equal to a first DC voltage value. Furthermore, the signal $BB_1-$ (e.g., the gate of the transistor 510 and the gate of the transistor 512) can be equal to a second DC voltage value. Moreover, the signal $BB_2+$ (e.g., the gate of the transistor 536 and the gate of the transistor 538) can be equal to the second DC voltage value. Furthermore, the signal $BB_2-$ (e.g., the gate of the transistor 540 and the gate of the transistor 542) can be equal to the first DC voltage value. As such, the signal $BB_1+$ and the signal $BB_1-$ of the first power mixer 206 can comprise a different polarity than the signal $BB_2+$ and the signal $BB_2-$ of the second power mixer 208. In an embodiment, the signal $BB_1+$ can be equal to 1.5V and the signal $BB_1-$ can be equal to 0V. In an aspect, the radar waveform signal provided by the signal generator 104 can be control signal to control a DC voltage value of the signal $BB_1+$, the signal $BB_1-$, the signal $BB_2+$ and/or the signal $BB_2-$. In another aspect, the first power mixer 206 shown in FIG. 6 can operate as a first differential power amplifier. The inductor 518, the inductor 520, the inductor 522 and/or the inductor 524 can also facilitate an expanded bandwidth for the RF signal. The first power mixer 206 shown in FIG. 6 can also employ device stacking to boost output power of the RF signal with higher supply voltage. In another embodiment, the signal $BB_2+$ can be equal to 0V and the signal $BB_2-$ can be equal to 1.5V. In an aspect, the second power mixer 208 shown in FIG. 6 can operate as a second differential power amplifier. The inductor 550, the inductor 522 and/or the inductor 554 can also facilitate an expanded bandwidth for the RF signal. The second power mixer 208 shown in FIG. 6 can also employ device stacking to boost output power of the RF signal. As such, the first mixed signal associated with the first power mixer 206 and the second mixed signal associated with the second power mixer 208 (e.g., the first mixed signal and the second mixed signal that are combined to form the RF signal) can facilitate generation of a FMCW RF signal. In a non-limiting example, RF signal 602 can be an example FMCW RF signal associated with the signal Out+ and the signal Out−.

Figure 7:
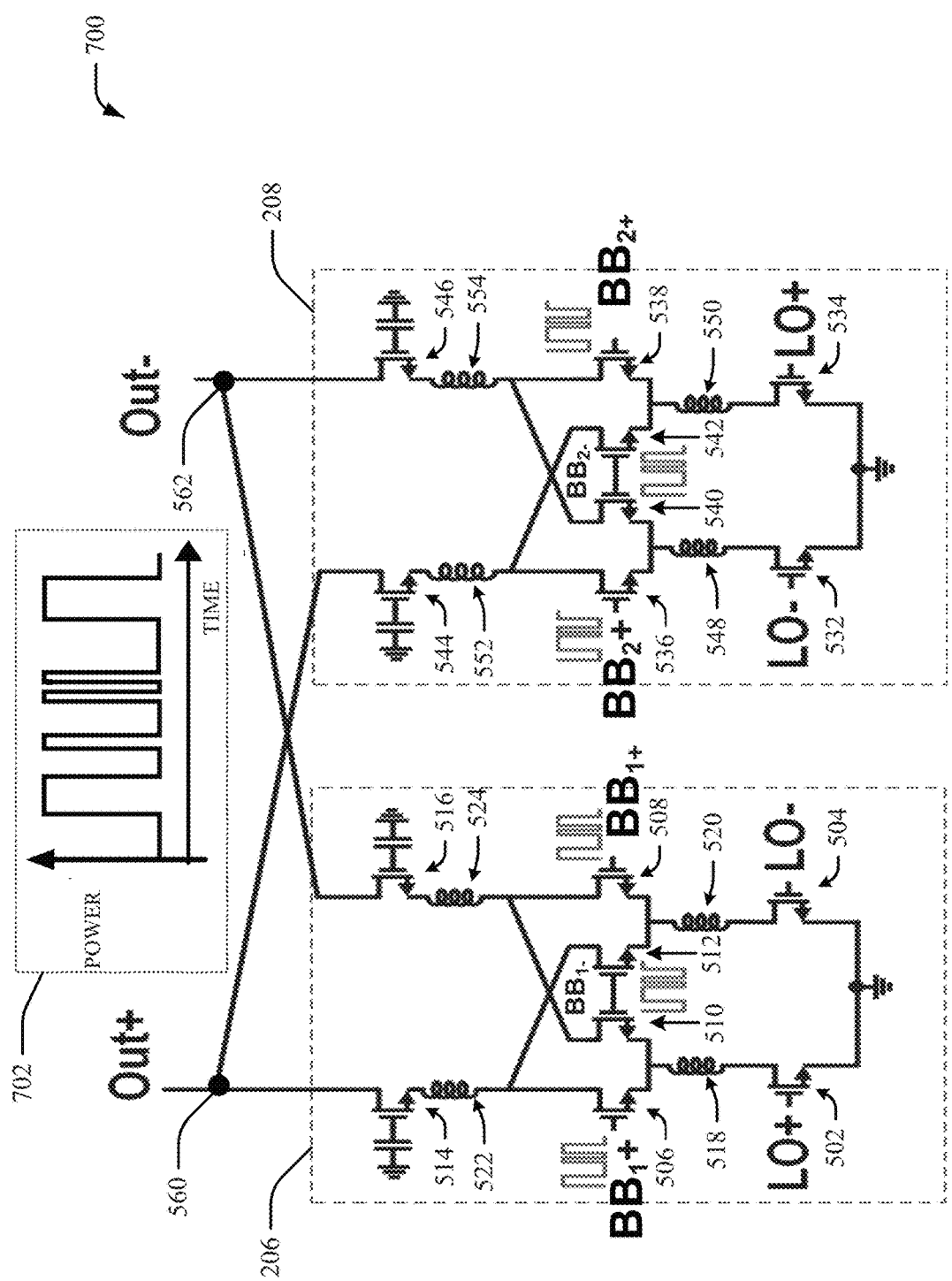
FIG. 7 illustrates a block diagram of an example, non-limiting system associated with a pseudorandom binary sequence mode in accordance with one or more embodiments described herein.

FIG. 7 illustrates a block diagram of an example, non-limiting system 700 in accordance with one or more embodiments described herein. Repetitive description of like elements employed in other embodiments described herein is omitted for sake of brevity.

The system 700 can include the first power mixer 206 and the second power mixer 208. The first power mixer 206 can include the transistor 502, the transistor 504, the transistor 506, the transistor 508, the transistor 510, the transistor 512, the transistor 514, the transistor 516, the inductor 518, the inductor 520, the inductor 522 and/or the inductor 524. The second power mixer 208 can include the transistor 532, the transistor 534, the transistor 536, the transistor 538, the transistor 540, the transistor 542, the transistor 544, the transistor 546, the inductor 548, the inductor 550, the inductor 522 and/or the inductor 554.

The system 700 can illustrate an embodiment of the first power mixer 206 and the second power mixer 208 during a PRBS mode. In an embodiment, the signal $BB_1+$ (e.g., the gate of the transistor 506 and the gate of the transistor 508) can correspond to a first PRBS waveform. Furthermore, the signal $BB_1-$ (e.g., the gate of the transistor 510 and the gate of the transistor 512) can correspond to a second PRBS waveform. In an aspect, the first power mixer 206 shown in FIG. 7 can operate as a first direct binary phase-shift keying (BPSK) modulator. In another embodiment, the signal $BB_2+$ (e.g., the gate of the transistor 536 and the gate of the transistor 538) can be equal to the second PRBS waveform. Furthermore, the signal $BB_2-$ (e.g., the gate of the transistor 540 and the gate of the transistor 542) can correspond to the first PRBS waveform. As such, the signal $BB_1+$ and the signal $BB_1-$ of the first power mixer 206 can comprise a different polarity than the signal $BB_2+$ and the signal $BB_2-$ of the second power mixer 208. In an aspect, the second power mixer 208 shown in FIG. 7 can operate as a second BPSK modulator. As such, the first mixed signal associated with the first power mixer 206 and the second mixed signal associated with the second power mixer 208 (e.g., the first mixed signal and the second mixed signal that are combined to form the RF signal) can facilitate generation of a PRBS RF signal. In a non-limiting example, RF signal 702 can be an example PRBS RF signal associated with the signal Out+ and the signal Out−.

Figure 8:
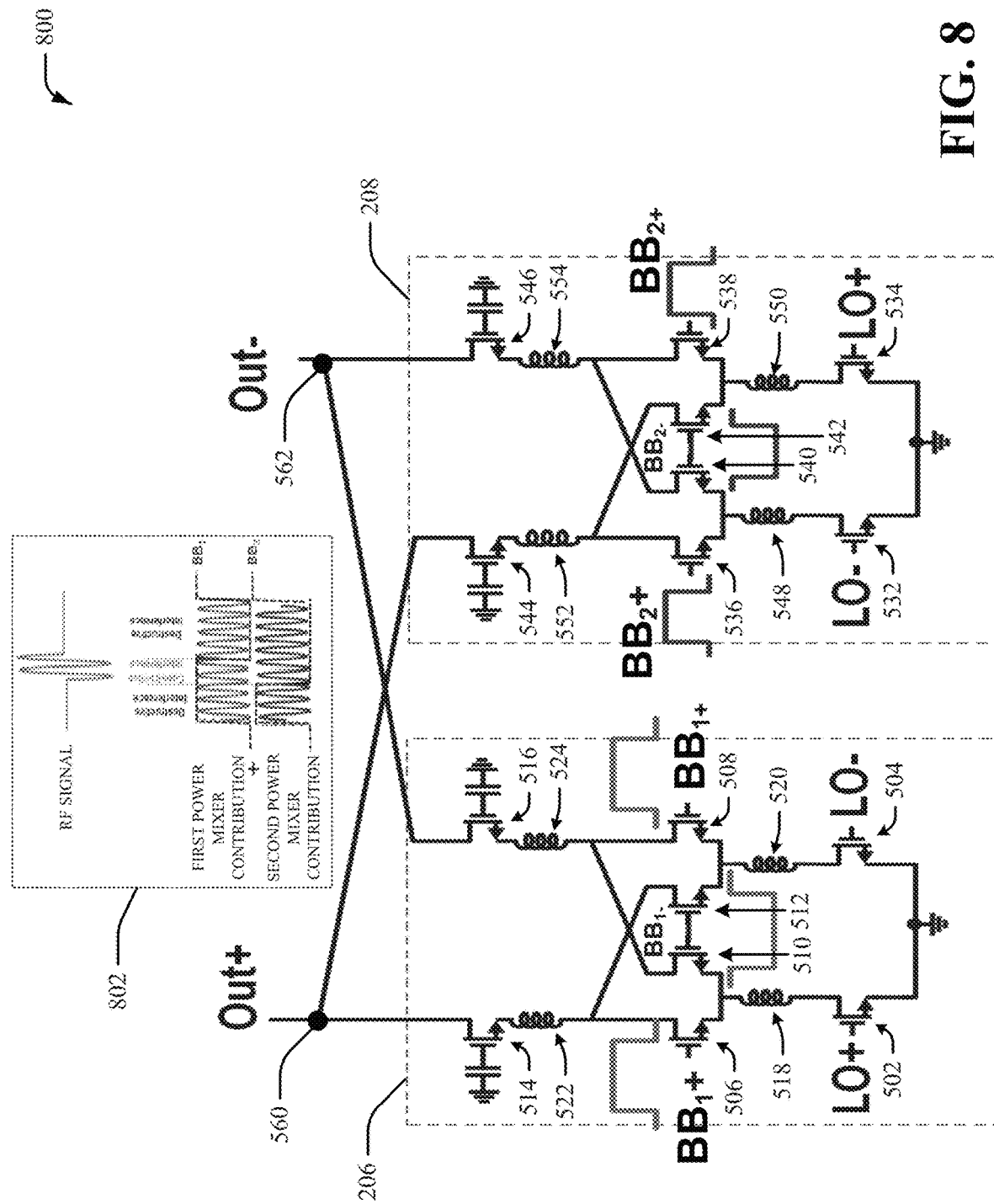
FIG. 8 illustrates a block diagram of an example, non-limiting system associated with a pulse binary sequence mode in accordance with one or more embodiments described herein.

FIG. 8 illustrates a block diagram of an example, non-limiting system 800 in accordance with one or more embodiments described herein. Repetitive description of like elements employed in other embodiments described herein is omitted for sake of brevity.

The system 800 can include the first power mixer 206 and the second power mixer 208. The first power mixer 206 can include the transistor 502, the transistor 504, the transistor 506, the transistor 508, the transistor 510, the transistor 512, the transistor 514, the transistor 516, the inductor 518, the inductor 520, the inductor 522 and/or the inductor 524. The second power mixer 208 can include the transistor 532, the transistor 534, the transistor 536, the transistor 538, the transistor 540, the transistor 542, the transistor 544, the transistor 546, the inductor 548, the inductor 550, the inductor 522 and/or the inductor 554.

The system 800 can illustrate an embodiment of the first power mixer 206 and the second power mixer 208 during a pulse mode. In an embodiment, the signal $BB_1+$ (e.g., the gate of the transistor 506 and the gate of the transistor 508) can correspond to a first pulse waveform (e.g., a first pulse control signal). Furthermore, the signal $BB_1-$ (e.g., the gate of the transistor 510 and the gate of the transistor 512) can correspond to a second pulse waveform (e.g., a second pulse control signal). In another embodiment, the signal $BB_2+$ (e.g., the gate of the transistor 536 and the gate of the transistor 538) can be equal to a third pulse waveform (e.g., a third pulse control signal). Furthermore, the signal $BB_2-$ (e.g., the gate of the transistor 540 and the gate of the transistor 542) can correspond to a fourth pulse waveform (e.g., a fourth pulse control signal). In an aspect, the third pulse waveform can comprise a different pulse width than the first pulse waveform. Additionally or alternatively, the fourth pulse waveform can comprise a different pulse width than the second pulse waveform. Therefore, the signal $BB_1+$ and the signal $BB_1-$ can comprise a same polarity as the signal $BB_2+$ and the signal $BB_2-$ while comprising different pulse waveforms. As such, the first mixed signal associated with the first power mixer 206 and the second mixed signal associated with the second power mixer 208 (e.g., the first mixed signal and the second mixed signal that are combined to form the RF signal) can facilitate generation of a pulse RF signal. For instance, the first mixed signal associated with the first power mixer 206 and the second mixed signal associated with the second power mixer 208 can facilitate generation of a pulse RF signal with a time duration that is shorter than that of the first pulse waveform and the second pulse waveform. In an aspect, a pulse width of the pulse RF signal can be generated based on a difference in pulse control width of the first pulse waveform and the second pulse waveform. In a non-limiting example, RF signal 802 can be an example pulse RF signal associated with the signal Out+ and the signal Out−.

Figure 9:
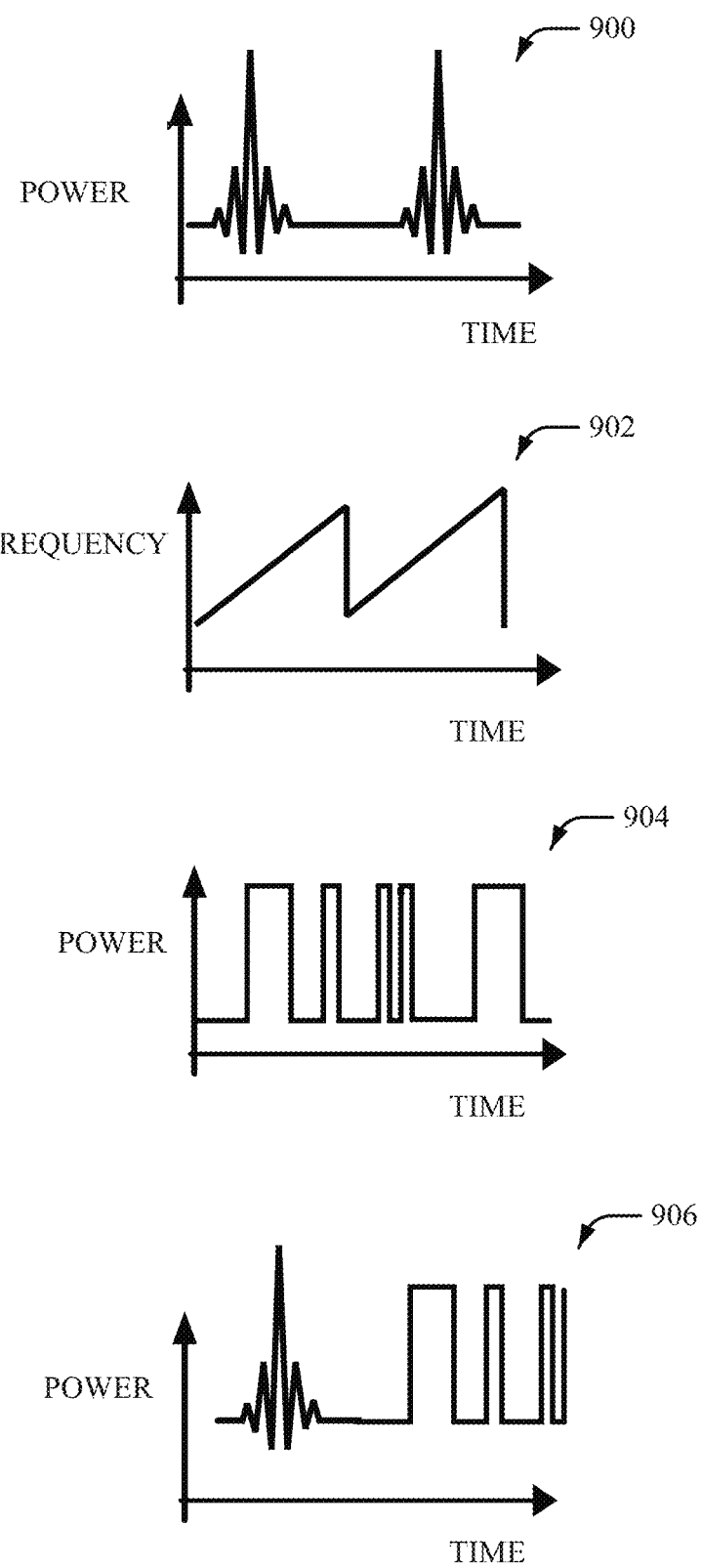
FIG. 9 illustrates example, non-limiting radio frequency signals in accordance with one or more embodiments described herein.

FIG. 9 illustrates example, non-limiting RF signals in accordance with one or more embodiments described herein. Repetitive description of like elements employed in other embodiments described herein is omitted for sake of brevity.

FIG. 9 includes an example, non-limiting RF signal 900, an example, non-limiting RF signal 902, an example, non-limiting RF signal 904 and an example, non-limiting RF signal 906. The RF signal 900, the RF signal 902, the RF signal 904 and the RF signal 906 can be an RF signal generated by the power modulator 102. For instance, the RF signal 900 can be a pulse RF signal generated by the power modulator 102. An x-axis of the RF signal 900 can correspond to time and a y-axis of the RF signal can correspond to power. The RF signal 900 can be employed for certain technical applications such as, for example, medical imaging applications, etc. The RF signal 902 can be a FMCW RF signal generated by the power modulator 102. An x-axis of the RF signal 902 can correspond to time and a y-axis of the RF signal can correspond to frequency. The RF signal 902 can be employed for certain technical applications such as, for example, target detection applications, device control applications, automotive radar applications, speed estimation applications, etc. The RF signal 904 can be a PRBS RF signal generated by the power modulator 102. An x-axis of the RF signal 904 can correspond to time and a y-axis of the RF signal can correspond to power. The RF signal 906 can be a mixed waveform RF signal generated by the power modulator 102. An x-axis of the RF signal 906 can correspond to time and a y-axis of the RF signal can correspond to power. In an embodiment, the RF signal 906 can include a pulse waveform and a PRBS waveform. In another embodiment, the RF signal 906 can include a FMCW waveform and a PRBS waveform. In an embodiment, the RF signal 906 can include a pulse waveform and a FMCW waveform.

It is to be appreciated that the power modulator 102 and/or the signal generator 104 performs one or more processes associated with reconfigurable transmission of a radar frequency signal that cannot be performed by a human (e.g., is greater than the capability of a single human mind). For example, an amount of data processed, a speed of processing of data and/or data types of the data processed by the power modulator 102 and/or the signal generator 104 over a certain period of time can be greater, faster and different than an amount, speed and data type that can be processed by a single human mind over the same period of time. The power modulator 102 and/or the signal generator 104 can also be fully operational towards performing one or more other functions (e.g., fully powered on, fully executed, etc.) while also performing the above-referenced one or more processes associated with reconfigurable transmission of a radar frequency signal. Moreover, the RF signal and/or a waveform of the RF signal generated by the power modulator 102 can include information that is impossible to obtain manually by a user. For example, a type of information included in the RF signal, an amount of information included in the RF signal and/or a variety of information included in the RF signal can be more complex than information obtained manually by a user. Furthermore, the radio waveform signal and/or a waveform of the radio waveform signal generated by the signal generator 104 can include information that is impossible to obtain manually by a user. For example, a type of information included in the radio waveform signal, an amount of information included in the radio waveform signal and/or a variety of information included in the radio waveform signal can be more complex than information obtained manually by a user.

FIG. 10 illustrates a flow diagram of an example, non-limiting method 1000 for facilitating reconfigurable transmission of a radar frequency signal in accordance with one or more embodiments described herein. At 1002, a signal source is divided, by a radar transmitter (e.g., by power splitter 204), into a first local oscillator signal and a second local oscillator signal. The signal source can be, for example, a local oscillator signal.

At 1004, a first mixed signal is generated, by the radar transmitter (e.g., by first power mixer 206), by mixing a first radar waveform signal from a set of radar waveform signals with a first local oscillator signal associated with a signal source. The first mixed signal can be, for example, a first radio frequency output signal. In an embodiment, the first radar waveform signal can be received from the set of radar waveform signals. The first radar waveform signal can be, for example, a first baseband signal. Furthermore, the first radar waveform signal can be a frequency-modulated continuous-wave radar signal, a pseudorandom binary sequence signal, or a pulse signal.

At 1006, a second mixed signal is generated, by the radar transmitter (e.g., by second power mixer 208), by mixing a second radar waveform signal configured as an antiphase signal of the first radar waveform signal with a second local oscillator signal associated with the signal source. The second mixed signal can be, for example, a second radio frequency output signal. In an embodiment, the second radar waveform signal can be received from the set of radar waveform signals. The second radar waveform signal can be, for example, a second baseband signal. Furthermore, the second radar waveform signal can be a frequency-modulated continuous-wave radar signal, a pseudorandom binary sequence signal, or a pulse signal.

At 1008, a radio frequency signal is generated, by the radar transmitter (e.g., by power combiner 210), by combining the first mixed signal and the second mixed signal. The radio frequency signal can be, for example, a reconfigurable radio frequency signal. For instance, the radio frequency signal can be a frequency-modulated continuous-wave radio frequency signal, a pseudorandom binary sequence radio frequency signal, and/or a pulse radio frequency signal based on type(s) of waveform(s) associated with the first radar waveform signal and the second radar waveform signal.

For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that, in certain embodiments, the methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Moreover, because at least generating a mixed signal, combining mixed signals and/or generating a radio frequency signal are established from a combination of electrical and mechanical components and circuitry, a human is unable to replicate or perform processing performed by the power modulator 102 (e.g., the amplifier 202, the power splitter 204, the first power mixer 206, the second power mixer 208 and/or the power combiner 210) disclosed herein. For example, a human is unable to generate a mixed signal, combine mixed signals and/or generate a radio frequency signal. Additionally, because at least generating a radar waveform signal established from a combination of electrical and mechanical components and circuitry, a human is unable to replicate or perform processing performed by the signal generator 104 (e.g., the FMCW component 302, the code component 304 and/or the pulse component 306) disclosed herein. For example, a human is unable to generate a radar waveform signal that is employed by the power modulator 102.

Figure 11:
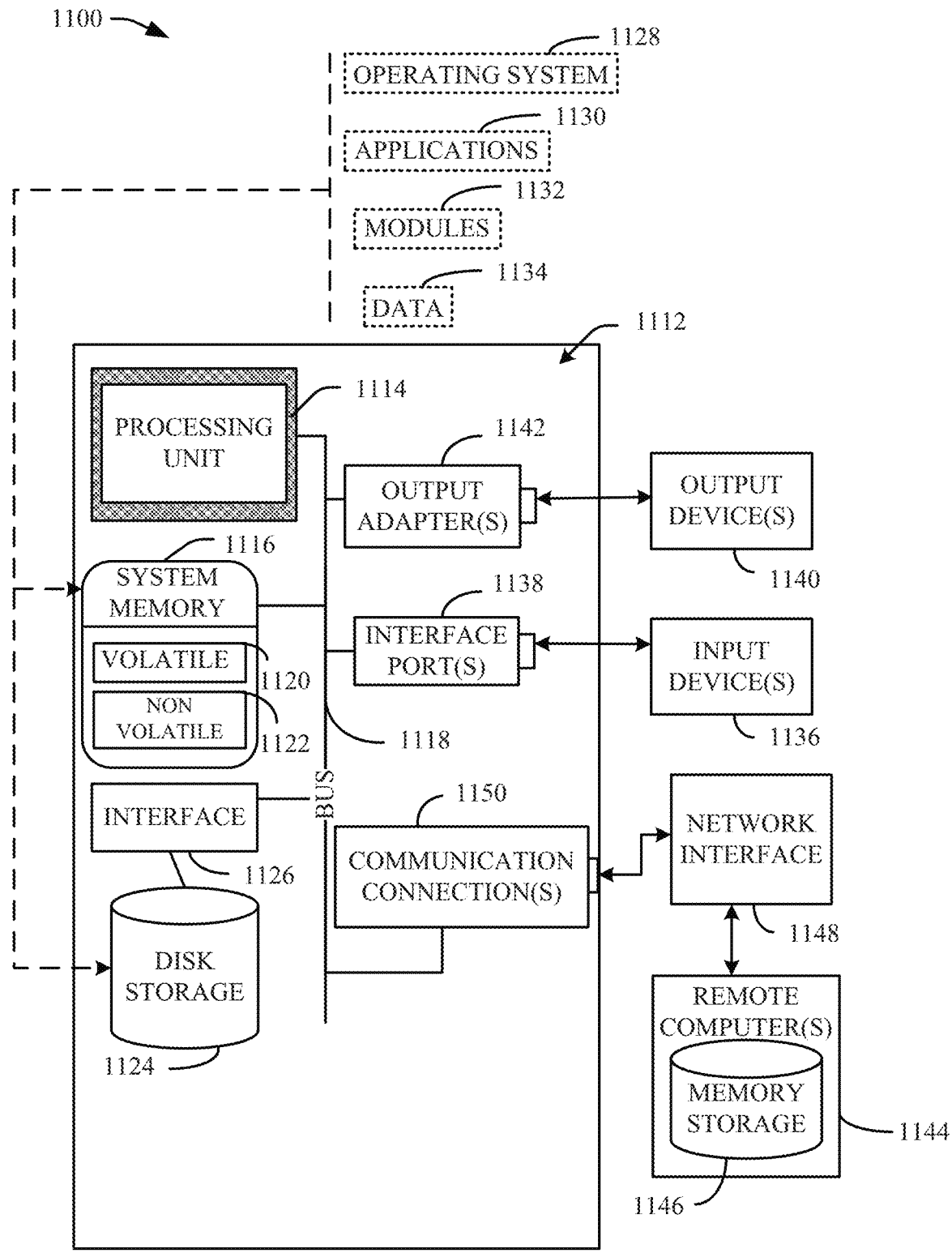
FIG. 11 illustrates a block diagram of an example, non-limiting operating environment in which one or more embodiments described herein can be facilitated.

In order to provide a context for the various aspects of the disclosed subject matter, FIG. 11 as well as the following discussion are intended to provide a general description of a suitable environment in which the various aspects of the disclosed subject matter can be implemented. FIG. 11 illustrates a block diagram of an example, non-limiting operating environment in which one or more embodiments described herein can be facilitated. Repetitive description of like elements employed in other embodiments described herein is omitted for sake of brevity.

With reference to FIG. 11, a suitable operating environment 1100 for implementing various aspects of this disclosure can also include a computer 1112. The computer 1112 can also include a processing unit 1114, a system memory 1116, and a system bus 1118. The system bus 1118 couples system components including, but not limited to, the system memory 1116 to the processing unit 1114. The processing unit 1114 can be any of various available processors. Dual microprocessors and other multiprocessor architectures also can be employed as the processing unit 1114. The system bus 1118 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1116 can also include volatile memory 1120 and nonvolatile memory 1122. The basic input/output system (BIOS), containing the basic routines to transfer information between elements within the computer 1112, such as during start-up, is stored in nonvolatile memory 1122. Computer 1112 can also include removable/non-removable, volatile/non-volatile computer storage media. FIG. 11 illustrates, for example, a disk storage 1124. Disk storage 1124 can also include, but is not limited to, devices like a magnetic disk drive, floppy disk drive, tape drive, Jaz drive, Zip drive, LS-100 drive, flash memory card, or memory stick. The disk storage 1124 also can include storage media separately or in combination with other storage media. To facilitate connection of the disk storage 1124 to the system bus 1118, a removable or non-removable interface is typically used, such as interface 1126. FIG. 11 also depicts software that acts as an intermediary between users and the basic computer resources described in the suitable operating environment 1100. Such software can also include, for example, an operating system 1128. Operating system 1128, which can be stored on disk storage 1124, acts to control and allocate resources of the computer 1112.

System applications 1130 take advantage of the management of resources by operating system 1128 through program modules 1132 and program data 1134, e.g., stored either in system memory 1116 or on disk storage 1124. It is to be appreciated that this disclosure can be implemented with various operating systems or combinations of operating systems. A user enters commands or information into the computer 1112 through input device(s) 1136. Input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 use some of the same type of ports as input device(s) 1136. Thus, for example, a USB port can be used to provide input to computer 1112, and to output information from computer 1112 to an output device 1140. Output adapter 1142 is provided to illustrate that there are some output devices 1140 like monitors, speakers, and printers, among other output devices 1140, which require special adapters. The output adapters 1142 include, by way of illustration and not limitation, video and sound cards that provide a means of connection between the output device 1140 and the system bus 1118. It should be noted that other devices and/or systems of devices provide both input and output capabilities such as remote computer(s) 1144.

Computer 1112 can operate in a networked environment using logical connections to one or more remote computers, such as remote computer(s) 1144. The remote computer(s) 1144 can be a computer, a server, a router, a network PC, a workstation, a microprocessor based appliance, a peer device or other common network node and the like, and typically can also include many or all of the elements described relative to computer 1112. For purposes of brevity, only a memory storage device 1146 is illustrated with remote computer(s) 1144. Remote computer(s) 1144 is logically connected to computer 1112 through a network interface 1148 and then physically connected via communication connection 1150. Network interface 1148 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1150 refers to the hardware/software employed to connect the network interface 1148 to the system bus 1118. While communication connection 1150 is shown for illustrative clarity inside computer 1112, it can also be external to computer 1112. The hardware/software for connection to the network interface 1148 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that, in certain embodiments, each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a signal generator that provides a radar waveform signal from a set of radar waveform signals; and
   a power modulator that divides a local oscillator signal associated with a first frequency and a first amplitude into a first local oscillator signal and a second local oscillator signal, and generates a radio frequency (RF) signal associated with a second frequency and a second amplitude based on the radar waveform signal, the first local oscillator signal and the second local oscillator signal, wherein a first pulse control waveform is provided to a first RF mixer circuit and a second pulse control waveform is provided to a second RF mixer circuit, wherein the first local oscillator signal comprises an opposite polarity than the second local oscillator signal, and wherein a time span of the RF signal is approximately equal to a difference between a first pulse control width of the first pulse control waveform and a second pulse control width of the second pulse control waveform.

2. The system of claim 1, wherein the power modulator mixes the first local oscillator signal with a first radar waveform signal provided by the signal generator to generate a first mixed signal, and wherein the power modulator mixes the second local oscillator signal with a second radar waveform signal provided by the signal generator to generate a second mixed signal.

3. The system of claim 2, wherein the power modulator combines the first mixed signal and the second mixed signal to generate the RF signal.

4. The system of claim 1, wherein a first phase of the first local oscillator signal is different than a second phase of the second local oscillator signal.

5. The system of claim 1, wherein the set of radar waveform signals provided by the signal generator comprise a frequency-modulated continuous-wave radar signal and a pulse signal.

6. The system of claim 1, wherein the set of radar waveform signals provided by the signal generator comprise a pseudorandom binary sequence signal and a pulse signal.

7. The system of claim 1, wherein the set of radar waveform signals provided by the signal generator comprise a frequency-modulated continuous-wave radar signal and a pseudorandom binary sequence signal.

8. The system of claim 1, wherein RF signal generated by the power modulator is a continuous radar waveform that comprises a first radar waveform and a second radar waveform that is different than the first radar waveform.

9. The system of claim 1, wherein the power modulator comprises a power splitter circuit that divides the local oscillator signal into the first local oscillator signal and the second local oscillator signal.

10. The system of claim 9, wherein the power modulator comprises the first RF mixer circuit that receives the first local oscillator signal, and wherein the power modulator comprises the second RF mixer circuit that receives the second local oscillator signal.

11. The system of claim 10, wherein the first RF mixer circuit generates a first RF signal based on the first local oscillator signal and the radar waveform signal, and wherein the second RF mixer circuit generates a second RF signal based on the second local oscillator signal and the radar waveform signal, and wherein the power modulator comprises a power combiner circuit that generates the RF signal based on the first RF signal and the second RF signal.

12. The system of claim 11, wherein the power combiner circuit comprises a power amplifier, a passive power combiner, and/or an antenna.

13. The system of claim 10, wherein the first pulse control waveform and the second pulse control waveform are aligned and comprise different widths.

14. The system of claim 1, wherein the system is a radar transmitter, and wherein the power modulator generates the RF signal to facilitate improved bandwidth of the radar transmitter.

15. A system, comprising:
   a first power mixer circuit that receives a first radar waveform signal as a first baseband signal that is mixed with a first local oscillator signal associated with a signal source, wherein the first radar waveform signal comprises a first polarity; and
   a second power mixer circuit that receives a second radar waveform signal as a second baseband signal that is mixed with a second local oscillator signal associated with the signal source, wherein the second radar waveform signal comprises a second polarity that is different than the first polarity, and wherein a radio frequency signal is generated based on the first baseband signal and the second baseband signal, wherein the first power mixer circuit comprises a first transistor structure that receives the first radar waveform signal and the first local oscillator signal, and wherein the second power mixer circuit comprises a second transistor structure that receives the second radar waveform signal and the second local oscillator signal.

* * * * *